United States Patent
Wildner et al.

(10) Patent No.: US 9,955,602 B2
(45) Date of Patent: Apr. 24, 2018

(54) ELECTRO-OPTICAL DISPLAY WITH A TRANSPARENT COVER

(71) Applicant: CONTINENTAL AUTOMOTIVE GMBH, Hannover (DE)

(72) Inventors: Steffen Wildner, Dieburg (DE); Kai Hohmann, Babenhausen (DE); Hans Wedel, Mühltal (DE); Peter Bolte, Buseck (DE)

(73) Assignee: Continental Automotive GmbH, Hannover (DE)

( * ) Notice: Subject to any disclaimer, the term of this patent is extended or adjusted under 35 U.S.C. 154(b) by 33 days.

(21) Appl. No.: 14/654,365

(22) PCT Filed: Dec. 19, 2013

(86) PCT No.: PCT/EP2013/077401
§ 371 (c)(1),
(2) Date: Jun. 19, 2015

(87) PCT Pub. No.: WO2014/096199
PCT Pub. Date: Jun. 26, 2014

(65) Prior Publication Data
US 2015/0351272 A1    Dec. 3, 2015

(30) Foreign Application Priority Data
Dec. 21, 2012    (DE) .................. 10 2012 224 352

(51) Int. Cl.
*G02F 1/1333*    (2006.01)
*H05K 5/03*    (2006.01)
(Continued)

(52) U.S. Cl.
CPC ......... *H05K 5/03* (2013.01); *G02F 1/133308* (2013.01); *H01L 27/3244* (2013.01);
(Continued)

(58) Field of Classification Search
CPC ..... G02F 1/13338; G02F 2001/133311; G02F 2001/13332; G02F 2001/133331; G02F 2202/28
See application file for complete search history.

(56) References Cited

U.S. PATENT DOCUMENTS 6,495,253 B1 * 12/2002 Koyama ............... B32B 27/08
428/343
8,647,727 B1 * 2/2014 Barnidge ............. G02B 5/0242
156/60
(Continued)

FOREIGN PATENT DOCUMENTS

EP    0 010 796    5/1980
EP    2 180 367    4/2010
(Continued)

Primary Examiner — Hoan C Nguyen
(74) Attorney, Agent, or Firm — Cozen O'Connor

(57) ABSTRACT

An electro-optical display device with a transparent cover and a display, a transparent bonding material being present between the electro-optical display and the transparent cover, the transparent cover being part of a tray, the sides of the tray being designed as a frame, the lateral surfaces of the electro-optical display being surrounded by the frame in a form-fitting manner and the electro-optical display being connected to the frame.

14 Claims, 2 Drawing Sheets

(51) Int. Cl.
  *H05K 5/00* (2006.01)
  *H05K 5/02* (2006.01)
  *H05K 5/06* (2006.01)
  *H01L 27/32* (2006.01)

(52) U.S. Cl.
  CPC ......... *H05K 5/0017* (2013.01); *H05K 5/0217* (2013.01); *H05K 5/069* (2013.01); *G02F 1/13338* (2013.01); *G02F 2001/13332* (2013.01); *G02F 2001/133311* (2013.01); *G02F 2001/133331* (2013.01); *G02F 2202/28* (2013.01)

(56) References Cited

U.S. PATENT DOCUMENTS

| | | | |
|---|---|---|---|
| 8,797,474 B2* | 8/2014 | Wurzel | G02F 1/1333 349/58 |
| 2005/0280746 A1 | 12/2005 | North et al. | |
| 2009/0135159 A1* | 5/2009 | Sun | G06F 3/0412 345/174 |
| 2009/0322999 A1* | 12/2009 | Sano | G02F 1/133308 349/122 |
| 2010/0164881 A1* | 7/2010 | Kuo | G06F 3/044 345/173 |
| 2011/0285934 A1* | 11/2011 | Watanabe | G02F 1/133526 349/58 |
| 2012/0027399 A1* | 2/2012 | Yeates | C03C 21/002 396/535 |
| 2012/0170284 A1 | 7/2012 | Shedletsky | |
| 2012/0194974 A1 | 8/2012 | Weber et al. | |
| 2012/0281381 A1* | 11/2012 | Sanford | G06F 1/1626 361/807 |
| 2014/0240911 A1* | 8/2014 | Cole | B29C 45/14311 361/679.3 |
| 2015/0077657 A1* | 3/2015 | Ma | H03K 17/96 349/12 |

FOREIGN PATENT DOCUMENTS

| | | |
|---|---|---|
| EP | 2 381 297 | 10/2011 |
| EP | 2 395 496 | 12/2011 |
| JP | 10179345 A * | 7/1998 |
| JP | 2000-293117 | 10/2000 |
| WO | WO 91/20178 | 12/1991 |

\* cited by examiner

ELECTRO-OPTICAL DISPLAY WITH A TRANSPARENT COVER

CROSS REFERENCE TO RELATED APPLICATIONS

This is a U.S. national stage of application No. PCT/EP2013/077401, filed on Dec. 19, 2013. Priority is claimed on German Application No. DE102012224352.6, filed Dec. 21, 2012, the content of which is incorporated herein by reference.

BACKGROUND OF THE INVENTION

1. Field of the Invention

The invention relates to an electro-optical display with a transparent cover.

2. Detailed Description of the Prior Art

Electro-optical displays, for example liquid-crystal displays or OLEDs, are known from the prior art, having a transparent bonding material present between the electro-optical display and the transparent cover. The electro-optical display is protected by this additional transparent cover. The bonding material known from the prior art adhesively bonds the electro-optical display to the transparent cover, and has the effect that the gap between the electro-optical display and the transparent cover cannot be seen, or can be seen only with great difficulty, so that the visual appearance is improved. Such electro-optical displays are often used in fields in which the transparent covers may be intentionally or unintentionally touched. The representation of the electro-optical display may in this case be perturbed by the pressure incurred, for example when vignetting occurs.

SUMMARY OF THE INVENTION

It is an object of one embodiment of the invention to prevent, or at least greatly restrict, impairments of the representation of the electro-optical display. The effect achieved by the transparent cover being part of a trough, the wall sides of the trough being configured as a frame and the electro-optical display being enclosed with a form fit by the frame on its side surfaces, and the electro-optical display being connected to the frame, is that forces that reach the surface of the transparent cover cannot directly reach the surface of the electro-optical display and thus cause vignetting, but are guided by the frame onto the side surfaces or the base surface of the electro-optical display, so that the pressure-sensitive surface of the electro-optical display is not affected. The transparent bonding material has less the purpose of adhesively bonding the transparent cover to the surface of the electro-optical display, but mainly the purpose of preventing the air gap between the transparent cover and the surface of the electro-optical display. Since the materials of the transparent cover and of the transparent bonding material are selected in such a way that their refractive indices are almost identical, the optical transitions between the individual materials are not visible.

If the trough is produced in one piece, it can be produced very simply and problems of leaks between the frame and the transparent cover do not occur.

If the frame is connected with a material fit to the transparent cover, two different materials can be used straightforwardly. Furthermore, the assembly of the electro-optical display with the transparent cover can be configured more variably. For example, the electro-optical display may first be inserted into the frame, then the container formed by the frame and the upper side of the electro-optical display may be filled with the transparent bonding material, and the transparent cover may only then be connected with a material fit to the frame. If the frame and the transparent cover are formed in one piece, the trough first has to be filled with the bonding material and only then can the electro-optical display be inserted into the frame.

If the transparent cover is planar, the electro-optical display has a known appearance.

The electro-optical display obtains a new kind of appearance when the surface of the transparent cover is curved. Because of the bonding material, the representation of the electro-optical display appears undistorted. By this configurational freedom, the electro-optical display can thus be better fitted into an environment which has round shapes rather than rectangular shapes. The configurational freedom is thus increased overall, without restricting the legibility of the electro-optical display.

Since the structure according to one embodiment of the invention protects the electro-optical display from the effects of external pressure, it can be used ideally in a touch screen. To this end, the touch-screen film is advantageously applied on the transparent cover, since this lies closest to an operating member, for example a finger of the operator or a stylus. If the touch-screen film is laminated onto the transparent cover, it is fastened particularly stably. If the touch-screen film is applied on the side of the transparent cover facing toward the electro-optical display, it is harder to see and is mechanically protected. If the transparent cover is printed on the side facing away from the electro-optical display in its edge region, this printing may be configured in such a way that the frame is no longer perceptible in plan view and a particularly attractive appearance of the electro-optical display can thus be produced. If the transparent cover is colored, a so-called black-screen effect can be achieved so that the electro-optical display is no longer visible when it is switched off, but only the surface of the colored transparent cover is visible. Since reflections by the transparent bonding material are greatly reduced, the transparent cover does not have to be colored very greatly to achieve this effect. The required brightness of the electro-optical display is therefore also not increased excessively.

BRIEF DESCRIPTION OF THE DRAWINGS

The invention will be explained in more detail below with the aid of the figures, in which.

DETAILED DESCRIPTION OF THE PRESENTLY PREFERRED EMBODIMENTS

Figure 1:
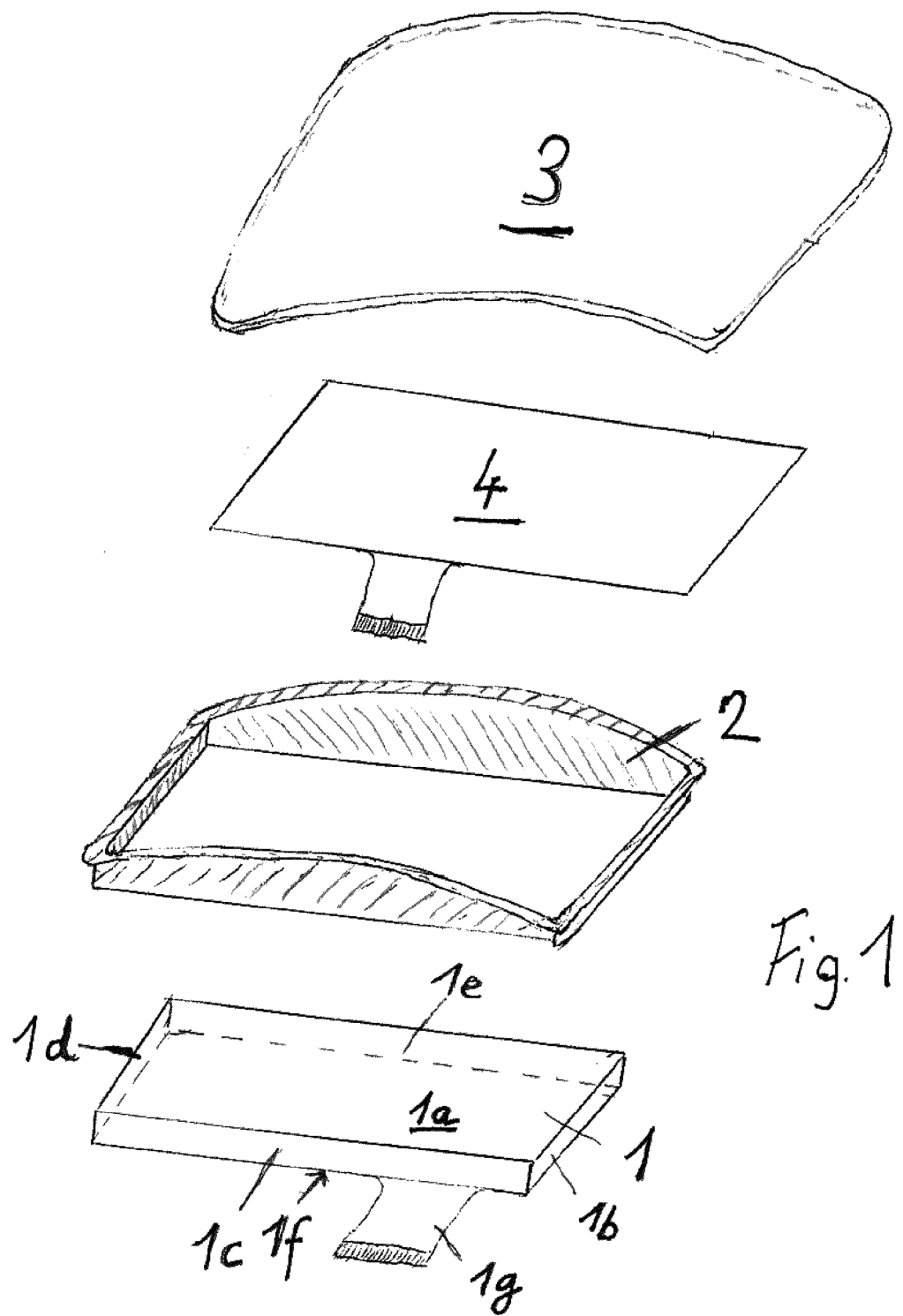
FIG. 1 is an exemplary embodiment of an electro-optical display with a transparent cover in exploded representation.

FIG. 1 shows an electro-optical display 1, a frame 2, a transparent cover 3 and a touch-screen film 4. The electro-optical display 1 has an upper side 1a, side surfaces 1b-1e, a lower side 1f and an electrical connection in the form of a ribbon cable 1g. In the operating state of the electro-optical display, the information represented by the electro-optical display is visible on the upper side 1a of the electro-optical display 1. This information may, for example, be generated by an LCD or an OLED. The electro-optical display 1 is configured in such a way that it fits into the frame 2 with a form fit. It can be seen that the transparent cover 3 has a curved surface, for example in the shape of a section of a cylinder. The transparent cover may likewise be formed in a planar fashion, configured as part of a section of a cone, or configured as any desired freeform surface. For configurational reasons, however, the cover may preferably be configured in a planar fashion or as part of a section of a cylinder, as represented in FIG. 1. In the assembled state, the touch-screen film 4 is connected to the transparent cover 3. It is particularly advantageous for the touch-screen film 4 to be laminated onto the transparent cover 3, since then the distance of the touch-screen film 4 from the surface of the transparent cover 3 is least and the sensitivity for detection of objects and extremities of a user, for example a finger of the user, lying on the surface of the transparent cover is therefore greatest. The transparent bonding material is not represented in FIG. 1.

Figure 2:
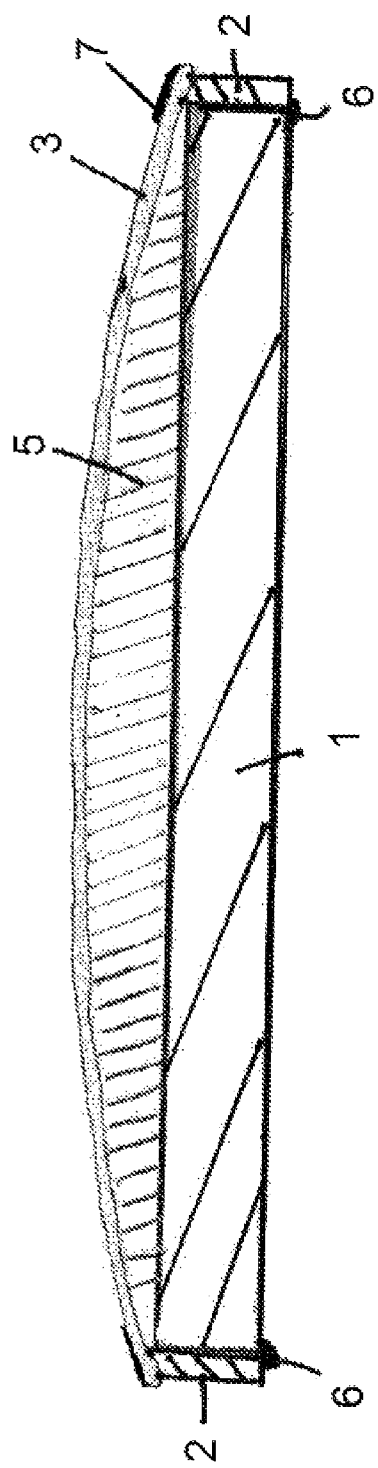
FIG. 2 is a section through the electro-optical display with a transparent cover of FIG. 1, without the touch-screen film represented in FIG. 1.

FIG. 2 shows the electro-optical display 1, the frame 2 and the transparent cover 3. Also represented is a transparent bonding material 5, which fully fills the space between the transparent cover 3 and the electro-optical display 1, with the same or almost the same refractive indices of the transparent cover 3 and of the transparent bonding material 5, the representation on the surface of the electro-optical display can be seen directly and without reflections. The transparent cover 3 lies on the frame 2 and is connected with a material fit thereto. Small channels, which allow air and bonding material possibly present in excess to escape when the electro-optical display is inserted into the bonding frame, are not represented in the drawings. The electro-optical display 1 is advantageously connected to the frame 2 in the region of its lower side 1f, for example by adhesive bonding or welding 6. In one embodiment, the transparent cover 3 has printing 7 in its edge region on its side facing away from the electro-optical display 1. The printing 7 may be configured such that the frame 2 is no longer perceptible in plan view.

The transparent cover 3 may also have a different shape; for example, it may also be configured in a fully planar fashion or have a freeform surface configured in any way.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An electro-optical display assembly comprising:
   an electro-optical display having:
      a display surface,
      a rear surface opposite the display surface; and
      at least two opposing lateral sides substantially perpendicular to the display surface;
   a frame configured to substantially contact the at least two opposing lateral sides of the electro-optical display;
   a transparent cover configured as at least part of a trough and configured to connect to an outer perimeter of a first end of the frame, wherein sides of the at least part of the trough are configured as a part of the frame; and
   a transparent bonding material arranged between the display surface of the electro-optical display and the transparent cover and configured to adhesively bond the transparent cover to the electro-optical display;
   wherein the electro-optical display is enclosed with a form fit by the frame on its side surfaces provided by the frame substantially contacting the lateral sides of the electro-optical display, and
   wherein a portion of the lateral side of the electro-optical display at the rear surface is physically connected to a second end of the frame that is opposite the first end of the frame.

2. The electro-optical display as claimed in claim 1, wherein the at least part of the trough is produced in one piece.

3. The electro-optical display as claimed in claim 1, wherein the frame is connected by a material fit to the transparent cover.

4. The electro-optical display as claimed in claim 1, wherein a refractive index of the transparent bonding material is substantially the same as a refractive index of the transparent cover.

5. The electro-optical display as claimed in claim 1, wherein a surface of the transparent cover is planar.

6. The electro-optical display as claimed in claim 1, wherein a surface of the transparent cover is curved.

7. The electro-optical display as claimed in claim 1, further comprising a touch-screen film applied on the transparent cover.

8. The electro-optical display as claimed in claim 7, wherein the touch-screen film is laminated onto the transparent cover.

9. The electro-optical display as claimed in claim 7, wherein the touch-screen film is applied on a side of the transparent cover facing toward the electro-optical display.

10. The electro-optical display as claimed in claim 1, wherein the transparent cover is printed on a side facing away from the electro-optical display in its edge region.

11. The electro-optical display as claimed in claim 1, wherein the transparent cover is colored.

12. The electro-optical display as claimed in claim 7, wherein the touch-screen film is applied on a side of the transparent cover facing toward the electro-optical display.

13. The electro-optical display as claimed in claim 7, wherein the electro-optical display is configured as one of an LCD and an OLED.

14. The electro-optical display assembly as claimed in claim 1,
   wherein the at least two opposing lateral sides of the electro-optical display are substantially planar and respective surfaces of the frame configured to substantially contact the at least two opposing lateral sides of the electro-optical display are substantially planar.

* * * * *